United States Patent
Pasotti et al.

(10) Patent No.: US 11,942,144 B2
(45) Date of Patent: Mar. 26, 2024

(54) IN-MEMORY COMPUTATION SYSTEM WITH DRIFT COMPENSATION CIRCUIT

(71) Applicants: STMicroelectronics S.r.l., Agrate Brianza (IT); Alma Mater Studiorum—Universita' Di Bologna, Bologna (IT)

(72) Inventors: Marco Pasotti, Travaco' Siccomario (IT); Marcella Carissimi, Bergamo (IT); Antonio Gnudi, Bologna (IT); Eleonora Franchi Scarselli, Bologna (IT); Alessio Antolini, Bologna (IT); Andrea Lico, Polia (IT)

(73) Assignees: STMicroelectronics S.r.l., Agrate Briana (IT); Alma Mater Studiorum—Universita' Di Bologna, Bologna (IT)

( * ) Notice: Subject to any disclaimer, the term of this patent is extended or adjusted under 35 U.S.C. 154(b) by 110 days.

(21) Appl. No.: 17/582,675

(22) Filed: Jan. 24, 2022

(65) Prior Publication Data
US 2023/0238055 A1 Jul. 27, 2023

(51) Int. Cl.
*G11C 11/4096* (2006.01)
*G06F 7/544* (2006.01)
(Continued)

(52) U.S. Cl.
CPC ........ *G11C 11/4096* (2013.01); *G06F 7/5443* (2013.01); *G11C 11/4074* (2013.01);
(Continued)

(58) Field of Classification Search
CPC ............ G11C 11/4096; G11C 11/4074; G11C 11/4076; G11C 11/4085; G11C 11/4094;
(Continued)

(56) References Cited

U.S. PATENT DOCUMENTS 8,699,273 B2 4/2014 Binboga
8,902,678 B2 12/2014 Dimartino et al.
(Continued)

FOREIGN PATENT DOCUMENTS

WO 2021137894 A1 7/2021
WO 2021158861 A1 8/2021

OTHER PUBLICATIONS

Dazzi, Martino, et al: "Accelerating Inference of Convolutional Neural Networks Using In-memory Computing," Frontiers in Computational Neuroscience, Aug. 2021, vol. 15, Article 674154, 19 pages.
(Continued)

*Primary Examiner* — Fernando Hidalgo
(74) *Attorney, Agent, or Firm* — Crowe & Dunlevy LLC

(57) ABSTRACT

A circuit includes a memory array with memory cells arranged in a matrix of rows and columns, where each row includes a word line connected to the memory cells of the row, and each column includes a bit line connected to the memory cells of the column. Computational weights for an in-memory compute operation (IMCO) are stored in the memory cells. A word line control circuit simultaneously actuates word lines in response to input signals providing coefficient data for the IMCO by applying word line signal pulses. A column processing circuit connected to the bit lines processes analog signals developed on the bit lines in response to the simultaneous actuation of the word lines to generate multiply and accumulate output signals for the IMCO. Pulse widths of the signal pulses are modulated to compensate for cell drift. The IMCO further handles positive/negative calculation for the coefficient data and computational weights.

54 Claims, 9 Drawing Sheets

(51) Int. Cl.
*G11C 11/4074* (2006.01)
*G11C 11/4076* (2006.01)
*G11C 11/408* (2006.01)
*G11C 11/4094* (2006.01)

(52) U.S. Cl.
CPC ...... *G11C 11/4076* (2013.01); *G11C 11/4085* (2013.01); *G11C 11/4094* (2013.01)

(58) Field of Classification Search
CPC ............ G11C 11/5678; G11C 13/0023; G11C 13/0026; G11C 2213/72; G11C 2213/79; G11C 13/0004; G11C 13/0028; G11C 13/003; G11C 13/0033; G11C 13/0061; G11C 2013/0092; G11C 11/54; G11C 13/0069; G11C 2013/0088; G06F 7/5443; G06F 2207/4814; G06F 2207/4824; G06N 3/048; G06N 3/063; G06N 3/065
USPC .................................................. 365/230.03
See application file for complete search history.

(56) References Cited

U.S. PATENT DOCUMENTS

| | | | |
|---|---|---|---|
| 8,953,360 | B2 | 2/2015 | Bedeschi |
| 9,396,795 | B1 | 7/2016 | Jeloka et al. |
| 9,508,446 | B1 | 11/2016 | Chen et al. |
| 9,859,008 | B1 | 1/2018 | Kim |
| 9,887,011 | B1 | 2/2018 | Hung |
| 10,056,145 | B2 | 8/2018 | Backhausen et al. |
| 10,073,733 | B1 | 9/2018 | Jain et al. |
| 10,319,449 | B1 | 6/2019 | Yang |
| 10,373,682 | B2 | 8/2019 | Parkinson et al. |
| 10,607,710 | B2 | 3/2020 | Tran et al. |
| 10,636,481 | B1 | 4/2020 | Chang et al. |
| 10,643,677 | B2 | 5/2020 | Yabe |
| 10,692,570 | B2 | 6/2020 | Al-Shamma |
| 10,762,958 | B2 | 9/2020 | Pyo et al. |
| 10,831,446 | B2 | 11/2020 | Chen et al. |
| 10,832,773 | B1 | 11/2020 | Kim et al. |
| 10,943,652 | B2 | 3/2021 | Lu et al. |
| 11,024,393 | B1 | 6/2021 | Zhang et al. |
| 11,043,259 | B2 | 6/2021 | Wentzlaff et al. |
| 11,048,434 | B2 | 6/2021 | Kumar et al. |
| 11,061,646 | B2 | 7/2021 | Sumbul et al. |
| 11,100,987 | B1 | 8/2021 | Mantegazza et al. |
| 2018/0260696 | A1 | 9/2018 | Suda et al. |
| 2019/0279709 | A1 | 9/2019 | Lee |
| 2019/0370640 | A1 | 12/2019 | Peng et al. |
| 2021/0019609 | A1 | 1/2021 | Strukov et al. |
| 2021/0033648 | A1 | 2/2021 | Khaddam-Aljameh et al. |
| 2021/0035636 | A1 | 2/2021 | Nazarian |
| 2021/0073621 | A1 | 3/2021 | Seo et al. |
| 2021/0134343 | A1 | 5/2021 | Li et al. |
| 2021/0271597 | A1 | 9/2021 | Verma et al. |
| 2021/0279036 | A1 | 9/2021 | Li et al. |
| 2021/0334639 | A1 | 10/2021 | Tran |
| 2021/0342671 | A1 | 11/2021 | Hoang et al. |
| 2021/0343320 | A1 | 11/2021 | Korng et al. |
| 2021/0366542 | A1 | 11/2021 | Lee et al. |
| 2022/0028444 | A1* | 1/2022 | Papageorgiou .......... G06N 3/08 |
| 2022/0044099 | A1 | 2/2022 | Conte et al. |
| 2022/0068380 | A1 | 3/2022 | Carissimi et al. |

OTHER PUBLICATIONS

Lelmini, Daniele, et al: "Device and Circuit Architectures for In-Memory Computing," Advanced Intelligent Systems, 2020, 19 pages.

Sebastian, Abu, et al: "Memory Devices and Applications for In-Memory Computing," Nature Nanotechnology, 2020, 16 pages.

Zhang, Jin, et al: "An 8T SRAM Array with Configurable Word Lines for In-Memory Computing Operation," Electronics, 2021, 10, 300, 14 pages.

Biswas, et al: "CONV-SRAM: An Energy-Efficient SRAM With In-Memory Dot-Product Computation for Low-Power Convolutional Neural Networks," IEEE Journal of Solid-State Circuits 54, No. 1, Dec. 17, 2018, pp. 217-230.

Chi, et al: "PRIME: A Novel Processing-In-Memory Architecture for Neural Network Computation in ReRAM-Based Main Memory," ACM SIGARCH Computer Architecture News 44, No. 3, Jun. 18, 2016, pp. 27-39.

Khaddam-Aljameh R et al: "Hermes Core—A 14NM CMOS and PCM-Based in Memory Compute Core Using an Array of 300PS/LSB Linearized CCO-Based ADCS and Local Digital Processing", 2021 Symposium on VLSI Circuits Digest of Technocal Papers, 3 pgs.

Mayahinia Mahta et al: "A Voltage-Controlled, Oscillation-Based ADC Design for Computation-in-Memory Architectures Using Emerging ReRAMs," ACM Journal on Emerging Technologies in Computing Systems, vol. 18, No. 2, Article 32, Pub date Mar. 2022, 26 pgs.

Mittal, Sparsh: "A Survey of ReRAM-Based Architectures for Processing-In-Memory and Neural Networks," Machine Learning and Knowledge Extractions 1, No. 1, Mar. 2019, pp. 75-114.

Xie, Chenchen, et al: "Speeding Up the Write Operation for Multi-Level Cell Phase Change Memory with Programmable Ramp-Down Current Pules," Micromachines 2019, www.mdpi.com/journal/micromachines, 13 pages.

Zhang Xueyong et al: "A 0.11-0.38 pJ/cycle Differential Ring Oscillator in 65 nm CMOS for Robust Neurocomputing," IEEE Transactions on Circuits and Systems—I: Regular Papers, vol. 68, No. 2, Feb. 2021, 15 pgs.

* cited by examiner

US 11,942,144 B2

IN-MEMORY COMPUTATION SYSTEM WITH DRIFT COMPENSATION CIRCUIT

TECHNICAL FIELD

Embodiments relate to an in-memory computation circuit and, in particular, to controlling memory cell drift with appropriate compensation.

BACKGROUND

An in-memory computation (IMC) system stores information in the bit cells of a memory array and performs calculations at the bit cell level. An example of a calculation performed by an IMC system is a multiply and accumulate (MAC) operation where an input array of numbers (x values, also referred to as the feature or coefficient data) are multiplied by an array of computational weights (g values) stored in the memory and the products are added together to produce an output (y values).

$$\begin{bmatrix} y_1 \\ y_2 \\ \vdots \\ y_m \end{bmatrix} \begin{bmatrix} g_{11} & g_{12} & \cdots & g_{1n} \\ g_{21} & g_{22} & \cdots & g_{2n} \\ \vdots & \vdots & \vdots & \vdots \\ g_{m1} & g_{m2} & \cdots & g_{mn} \end{bmatrix} \times \begin{bmatrix} x_1 \\ x_2 \\ \vdots \\ x_n \end{bmatrix}$$

$$\begin{cases} y_1 = g_{11} \times x_1 + g_{12} \times x_2 + \ldots + g_{1n} \times x_n \\ y_2 = g_{21} \times x_1 + g_{22} \times x_2 + \ldots + g_{2n} \times x_n \\ \vdots \\ y_m = g_{m1} \times x_1 + g_{m2} \times x_2 + \ldots + g_{mn} \times x_n \end{cases}$$

By performing these calculations at the bit cell level in the memory, the IMC system does not need to move data back and forth between a memory device and a computing device. Thus, the limitations associated with data transfer bandwidth between devices are obviated and the computation can be performed with lower power consumption.

SUMMARY

In an embodiment, an in-memory computation circuit comprises: a memory array including a plurality of memory cells arranged in a matrix with plural rows and plural columns, each row including a first word line connected to the memory cells of the row, and each column including a first bit line connected to the memory cells of the column, wherein computational weights for an in-memory compute operation are stored in the memory cells; a word line control circuit configured to simultaneously actuate the plurality of first word lines in response to input signals providing coefficient data for said in-memory compute operation by applying word line signal pulses to the first word lines; and a column processing circuit connected to the first bit lines and configured to process analog signals developed on the first bit lines in response to the simultaneous actuation of the plurality of first word lines to generate multiply and accumulate output signals for said in-memory compute operation.

In an embodiment, the memory array for the in-memory computation circuit further includes a plurality of reference memory cells connected to a reference word line to receive a reference word line signal pulse and connected to a reference bit line; and the word line control circuit is further configured to modulate pulse widths of the word line signal pulses in response to an analog reference signal developed on the reference bit line in response to the actuation of the reference word line by the reference word line signal pulse.

In an embodiment, the modulation of the pulse widths is implemented by controlling a frequency of a clock signal driving a counter circuit used to generate pulse widths for the word line signal pulses.

In an embodiment, the modulation of the pulse widths is implemented by controlling a slope of a ramp signal for a comparator used to generate pulse widths for the word line signal pulses.

In an embodiment, the in-memory computation circuit is configured to further account for positive/negative values for the input signals providing coefficient data for the in-memory compute operation.

In an embodiment, the in-memory computation circuit is configured to further account for positive/negative values for the computational weights of the in-memory compute operation.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
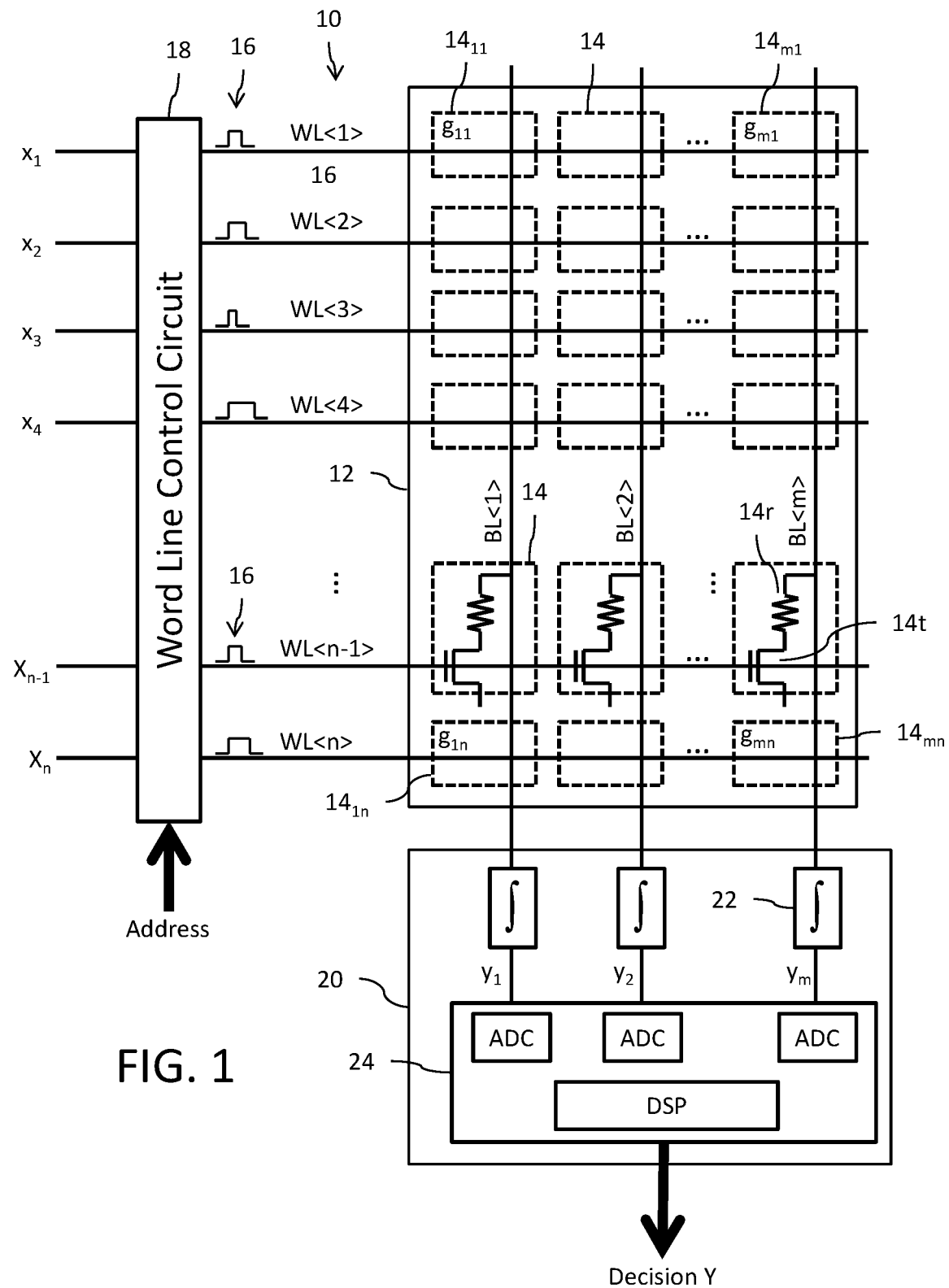
FIG. 1 is a schematic diagram of an in-memory computation circuit.

Reference is now made to FIG. 1 which shows a schematic diagram of an in-memory computation circuit 10. The circuit 10 utilizes a memory array 12 formed by a plurality of memory cells 14 arranged in a matrix format having n rows and m columns. Each memory cell 14 is programmed to store data $g_{mn}$ relating to the computational weights for an in-memory compute operation. Each memory cell 14 includes a word line WL and a bit line BL. The memory cells 14 in a common row of the matrix are connected to each other through a common word line WL. The memory cells 14 in a common column of the matrix are connected to each other through a common bit line BL. The word lines WL<1>, ..., WL<n> are driven by a word line control circuit 18. The word line signals 16 applied to the word lines by the word line control circuit 18 are generated from feature (or coefficient) data x input to the in-memory computation circuit 10. This feature data may, for example, comprise a plurality of multi-bit digital signals $x_1, \ldots, x_n$ that are processed by the word line control circuit 18 to generate the word line signals 16. A column processing circuit 20 receives the analog signals on the bit lines BL for the m columns and generates the multiply and accumulate (MAC) decision outputs y for the in-memory compute operation. The column processing circuit 20 may, for example, be implemented to integrate the analog signal on each bit lines BL using an integrator circuit 22 to generate the outputs $y_1, \ldots, y_m$, and then further process a combination of those outputs $y_1, \ldots, y_m$ to generate an overall output decision Y using a processing circuit 24. The processing circuit 24 may include, for example, an analog-to-digital converter (ADC) circuit for each bit line BL that functions to convert the integrated analog signal to a digital value, and a digital signal processing circuit (DSP) that functions to process the digital values output from the DACs.

Figure 1A:
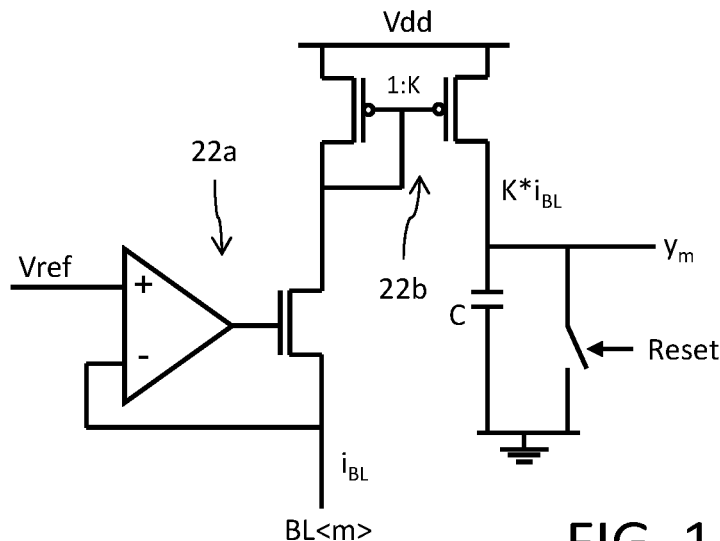
FIG. 1A is a schematic diagram of an integration circuit for use in the circuit of FIG. 1.

An example integrator circuit 22 is shown in FIG. 1A. A voltage regulator circuit 22a of the low drop-out (LDO) type (which may be implement, by example, with a differential amplifier and transistor with feedback) receives a reference voltage Vref and regulates the voltage on the bit line BL to match Vref. The bit line current $i_{BL}$ on the bit line BL is mirrored by a current mirroring circuit 22b (with a mirroring ratio of 1:K) and applied as a current $K*i_{BL}$ to charge an integration capacitor C and generate the integrated output voltage y. A switch circuit coupled in parallel with the integration capacitor C discharges the capacitor in response to assertion of a reset signal. The integration value y is converted to a digital value by the ADC circuit to produce the y output.

Figure 1B:
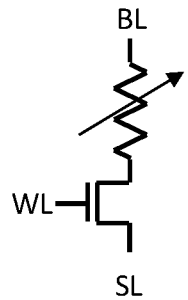
FIGS. 1B, 1C and 1D illustrate example implementations of the memory cell.
Figure 1C:
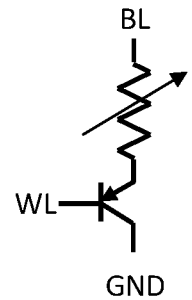
Figure 1D:
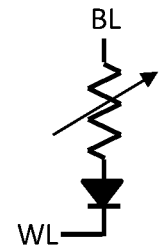

In a preferred embodiment, each memory cell 14 is a phase change memory (PCM) cell comprising a select circuit (MOSFET transistor, BJT transistor, diode device, etc.) 14t and a variable resistive element 14r. See, FIGS. 1B, 1C and 1D.

In case of a MOSFET transistor for the select circuit 14t (FIG. 1), the control node (gate) of the MOSFET transistor is connected to the word line WL. The source-drain path of the MOSFET transistor is connected in series with the variable resistive element 14r between the bit line BL and a reference node (for example, a source line (SL) or ground). More specifically, a drain of the MOSFET transistor is connected to a first terminal of the variable resistive element 14r, the source of the MOSFET transistor is connected to the reference node, and the second terminal of the variable resistive element 14r is connected to the bit line BL.

In case of a BJT transistor for the select circuit 14t (FIG. 1C), the control node (base) of the BJT transistor is connected to the word line WL. The conduction path of the BJT transistor is connected in series with the variable resistive element 14r between the bit line BL and a reference node (for example, ground). More specifically, the emitter of the BJT transistor is connected to a first terminal of the variable resistive element 14r, the collector of the BJT transistor is connected to the reference node (for example, ground), and the second terminal of the variable resistive element 14r is connected to the bit line BL. In this case the WL driver has the opposite polarity respect to the MOS select transistor case.

In case of a diode device for the select circuit 14t (FIG. 1D), the control node of the select device 14t is connected to the word line WL. The diode path of the select circuit 14t is connected in series with the variable resistive element 14r between the bit line BL and the word line. More specifically, one terminal of the diode device is connected to a first terminal of the variable resistive element 14r, the other is connected to the word line, and the second terminal of the variable resistive element 14r is connected to the bit line BL.

As is well known to those skilled in the art, a PCM-type memory cell 14 is configured to store data using phase change materials (such as chalcogenide) that are capable of stably transitioning between amorphous and crystalline phases according to an amount of heat transferred thereto. The amorphous and crystalline phases exhibit two or more distinct resistances (corresponding to the variable resistive element 14r), in other words two or more distinct transconductances, which are used to distinguish two or more distinct logic states programmable into the memory cell. The amorphous phase exhibits a relatively higher resistance (i.e., a lower transconductance) and thus the current sunk from the bit line BL by the memory cell programmed in this state when selected by assertion of the word line signal at the gate of the select circuit 14t is relatively smaller. Conversely, the crystalline phase exhibits a relatively lower resistance (i.e., a higher transconductance) and thus the current sunk from the bit line BL by the memory cell programmed in this state when selected by assertion of the word line signal at the gate of the select circuit 14t is relatively larger.

In an embodiment for a specific, but non-limiting, example for two distinct logic states: the amorphous phase may represent programming of the memory cell to logic "0" (or reset state) for the associated coefficient weight and the crystalline phase may represent programming of the memory cell to logic "1" (or set state) for the associated coefficient weight. In an embodiment for a three or more distinct logic states: varying degrees of the amorphous phase (with different resistances) plus the crystalline phase may be used to represent programming of the memory cell into three or more corresponding levels.

It will be understood that other memory cell types could instead be used for the array 12. For example, magnetoresistive random access memory (MRAM) cells or resistive random access memory (RRAM) cells could be used. The memory cell may alternatively comprise a static random access memory (SRAM) cell.

The word line control circuit 18 performs the function of selecting which ones of the word lines WL<1> to WL<n> are to be simultaneously accessed (or actuated) in parallel during an in-memory compute operation, and further functions to control application of pulsed word line signals 16 to the word lines WL in accordance with execution of that in-memory compute operation. FIG. 1 illustrates, by way of example only, the simultaneous actuation of all n word lines with the pulsed word line signals 16, it being understood that some in-memory compute operations may instead utilize a simultaneous actuation of fewer than all rows of the memory array. In such a case, the word line control circuit 18 may further receive address data (Address) which is decoded to specify which plural ones of the word lines WL are to be actuated for the given in-memory compute operation. The analog signal (for example, sunk bit line current $i_{BL}$) which develops on each bit line BL is dependent on the programmed level of the memory cells 14 for the computational weight in the corresponding column and the widths of the pulsed word line signals 16 applied to those memory cells 14. This bit line current $i_{BL}$ is integrated by the integrator circuit 22 to generate the signal y.

The implementation illustrated in FIG. 1 shows an example in the form of a pulse width modulation (PWM) for the applied word line signals for the in-memory compute operation. The word line control circuit 18 converts the value of the received multi-bit digital signal x for the feature or coefficient data to a corresponding pulse width for the asserted word line signal 16. In other words, the width of the pulse for the word line signal 16 is proportional to the digital value of the multi-bit digital signal x.

Figure 2A:
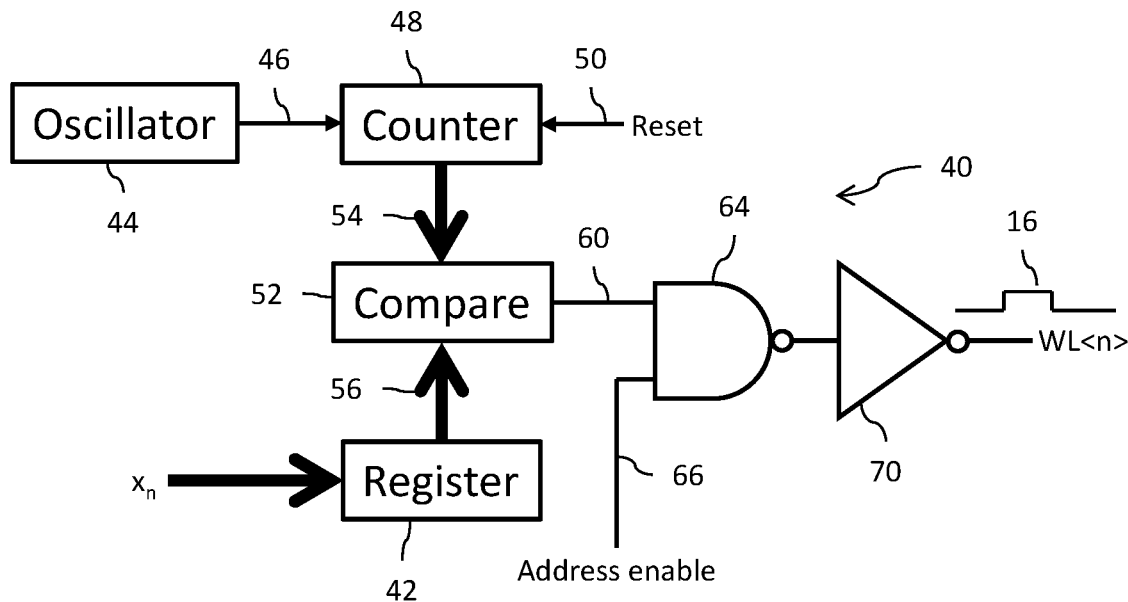
FIGS. 2A and 2B show circuit diagrams for timing control circuits used for word line signal control in the circuit of FIG. 1.

FIG. 2A shows an embodiment for a digital timing control circuit 40 within the word line control circuit 18 to generate the word line signal 16 from the multi-bit digital signal x for a given word line WL. This circuit 40 is replicated n times in the word line control circuit 18 so that there is one circuit 40 per word line WL. The digital timing control circuit 40 includes a register 42 that is configured to store the digital value 56 of the multi-bit digital signal $x_n$. A digital comparator circuit 52 includes a first input coupled to receive the digital value 56 from the register 42 and a second input coupled to receive a count value 54 output from a counter circuit 48. The digital comparator circuit 52 may be implemented, for example, using a local XOR bit checking circuit. An oscillator circuit 44 generates a clock signal 46 that is applied to control the counting operation performed by the counter circuit 48. The comparator circuit 52 functions to compare the digital value 56 to the count value 54 and assert a match signal 60 when the two values are the same. The match signal 60 is applied to a first input of a logic NAND gate 64. The second input of the logic NAND gate 64 receives an address enable signal 66 that is asserted when decoding of the address data indicates that the word line WL is to be asserted in connection with performing the in-memory compute operation. The output of the NAND gate 64 is coupled to the input of a word line driver circuit 70 (for example, implemented as a logic inverter circuit), and the output of the word line driver circuit 70 is coupled to the word line WL.

In an embodiment, the oscillator circuit 44 and counter circuit 48 are preferably shared by the plurality of digital timing control circuits 40 within the word line control circuit 18.

The digital timing control circuit 40 operates as follows. The counter circuit 48 is reset in response to assertion of a reset signal 50 at the beginning of the in-memory compute operation (i.e., the assertion of the reset signal indicates a start of the computation elaboration and is associated with the decoding of the Address to select the word lines to be simultaneously asserted). If the address enable signal is asserted (logic high) indicating that the word line is participating in the in-memory computation, the match signal 60 will be deasserted (logic high), the output of the NAND gate 64 will be logic low, and the word line signal 16 is then asserted (logic high) to provide the leading edge of the word line signal pulse. Following reset, the counter circuit 48 responds to the clock signal 46 and begins counting. When the comparator circuit 52 detects that the count value 54 matches the digital value 56 for the multi-bit digital signal x, the match signal 60 will be asserted (logic low). In response thereto, the output of the NAND gate 64 will be logic high, and the word line signal 16 is then deasserted (logic low) to provide the trailing edge of the word line signal pulse.

Figure 2B:
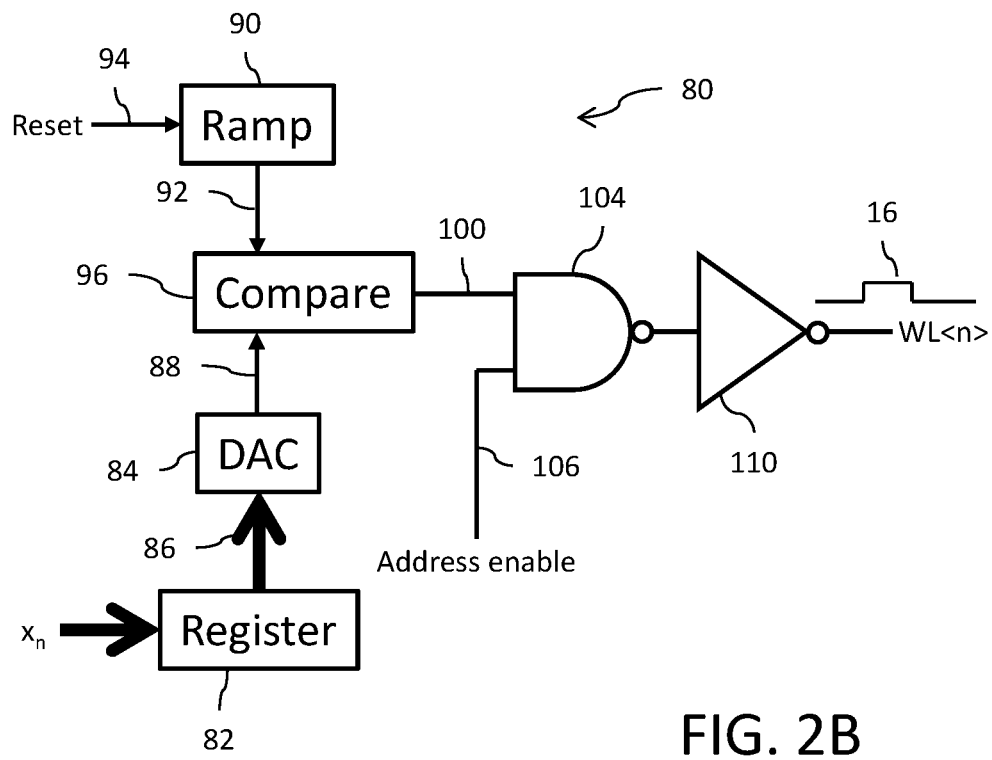

FIG. 2B shows an embodiment for an analog timing control circuit 80 within the word line control circuit 18 to generate the word line signal 16 from the multi-bit digital signal x for a given word line WL. This circuit 80 is replicated n times in the word line control circuit 18 so that there is one circuit 80 per word line WL. The analog timing control circuit 80 includes a register 82 that is configured to store the digital value 86 of the multi-bit digital signal $x_n$. A digital to analog converter (DAC) circuit 84 has an input that receives the digital value 86 and an output generating an analog voltage 88 corresponding to that digital value. A ramp generator circuit 90 generates a ramp signal 92 in response to assertion of a reset signal 94. An analog comparator circuit 96 includes a first input coupled to receive the analog voltage 88 from the DAC 84 and a second input coupled to receive the ramp signal 92 output from the ramp generator circuit 90. The comparator circuit 96 functions to compare the analog voltages and assert a match signal 100 when the ramp signal 92 voltage exceeds the analog voltage 88. The match signal 100 is applied to a first input of a logic NAND gate 104. The second input of the logic NAND gate 104 receives an address enable signal 106 that is asserted when decoding of the address data indicates that the word line WL is to be asserted in connection with performing the in-memory compute operation. The output of the NAND gate 104 is coupled to the input of a word line driver circuit 110 (for example, implemented as a logic inverter circuit), and the output of the word line driver circuit 110 is coupled to the word line WL.

In an embodiment, the ramp generator circuit 90 is preferably shared by the plurality of digital timing control circuits 80 within the word line control circuit 18.

The analog timing control circuit 80 operates as follows. The ramp signal 92 is reset in response to assertion of a reset signal 94 at the beginning of the in-memory compute operation (i.e., the assertion of the reset signal indicates a start of the computation elaboration and is associated with the decoding of the Address to select the word lines to be simultaneously asserted). If the address enable signal is asserted (logic high) indicating that the word line is participating in the in-memory computation, the match signal 100 will be deasserted (logic high), the output of the NAND gate 104 will be logic low, and the word line signal 16 is then asserted (logic high) to provide the leading edge of the word line signal pulse. Following reset, the voltage level of the ramp signal 92 increases. When the comparator circuit 96 detects that the ramp signal voltage exceeds the analog voltage 88 corresponding to the digital value of the multi-bit digital signal x, the match signal 100 will be asserted (logic low). In response thereto, the output of the NAND gate 104 will be logic high, and the word line signal 16 is then deasserted (logic low) to provide the trailing edge of the word line signal pulse.

With reference once again to FIG. 1, the individual cell current $i_{cell}$ for a given selected memory cell $14_{mn}$ is dependent on a product between the pulse width of the word line signal 16 (which corresponds to the digital value $x_n$) that is applied to that selected memory cell 14 and the transconductance (which corresponds to the programmed resistivity) of that selected memory cell 14. In other words, the memory cell contributes a current having a charge function that is proportional to $x_n \times g_{mn}$. The overall bit line current $i_{BL}$, however, is dependent on the sum of the memory cell currents in the column. In other words, the output voltage is proportional to $y_m = g_{m1} \times x_1 + g_{m2} \times x_2 + \ldots + g_{mn} \times x_n$.

Accuracy of the in-memory computation operation is dependent on the transconductance $g_{mn}$ of the memory cells 14. It is recognized that the transconductance $g_{mn}$ of the memory cells 14 may experience a drift over time (for example, conductance may decrease over time due to amorphization and relaxation of the crystal lattice). Compensating for that temporal drift is important in order to ensure continued computation accuracy.

Figure 3:
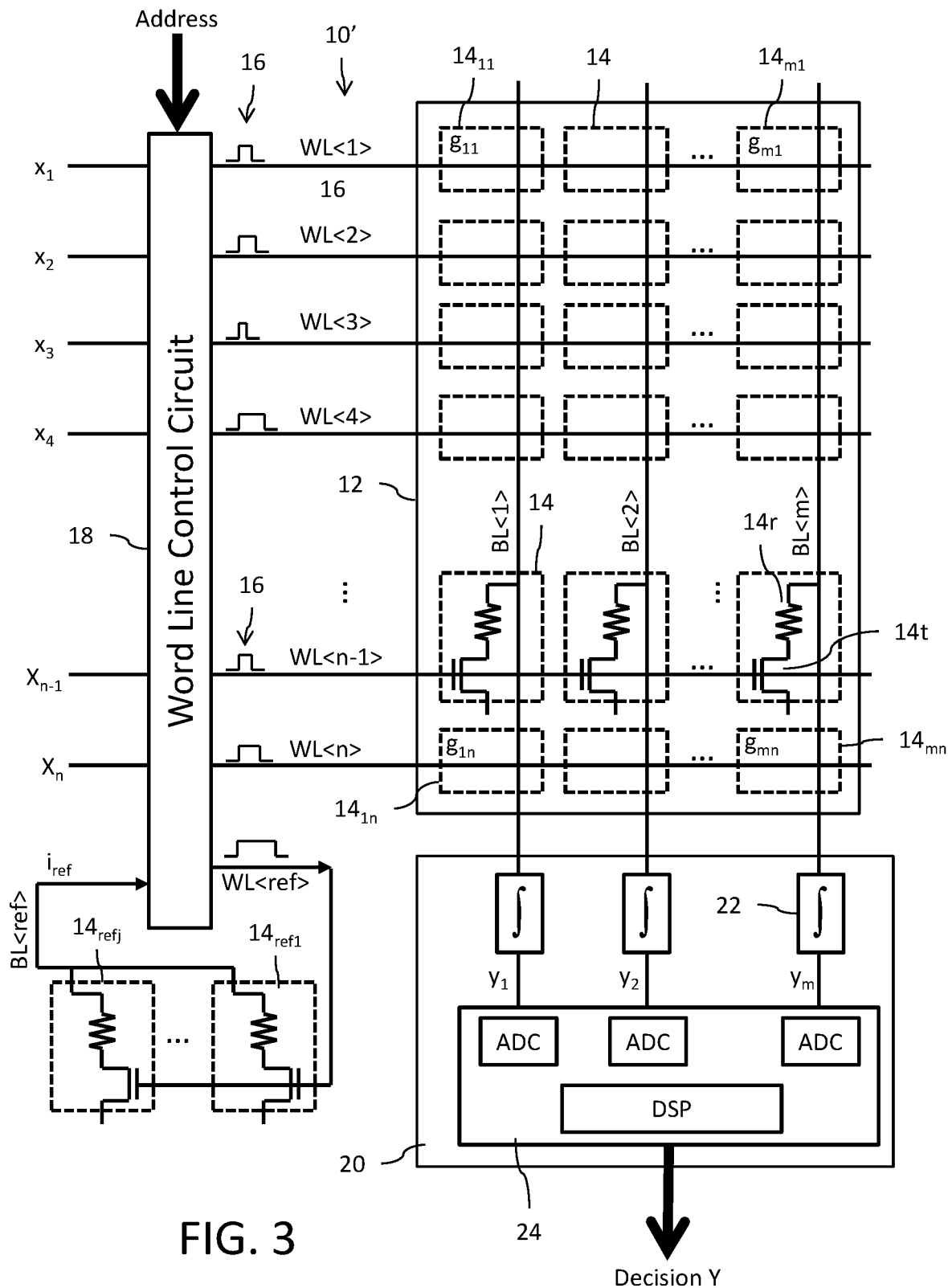
FIG. 3 is a schematic diagram of an in-memory computation circuit having a drift compensation functionality.

Reference is now made to FIG. 3 which shows a schematic diagram of an in-memory computation circuit 10' having a drift compensation functionality. Like references in FIGS. 1 and 3 refer to like or similar components whose description will not be repeated here for sake of brevity. The circuit 10' of FIG. 3 differs from the circuit 10 of FIG. 1 in that the memory array 12 includes an additional set of reference memory cells $14_{ref}$. In this example, the additional set includes j memory cells $14_{ref1}$ to $14_{refj}$ which are driven by a common reference word line WL<ref>. The reference memory cells $14_{ref}$ have an identical circuit configuration as the memory cells $14_{mn}$. In other words, the memory cells $14_{ref}$ and $14_{mn}$ are replica or matching circuits using the same size select circuits $14t$ and same resistor $14r$ construction. Each reference memory cell $14_{ref}$ is programmed to store reference data $g_{ref}$ relating to a reference operation. The plurality of reference memory cells $14_{ref}$ are connected to share a common reference bit line BL<ref>.

The individual cell current for each reference memory cell $14_{ref}$ is dependent on a product between the pulse width of the word line signal 16 (which corresponds to a maximum digital value $x_{max}$) on the reference word line WL<ref> and the transconductance (which corresponds to the programmed resistivity) of the reference memory cell $14_{ref}$. In other words, each reference memory cell contributes a cell current to the overall reference bit line current $i_{ref}$ with a charge function that is proportional to $x_{max} \times g_{ref}$. The reference bit line BL<ref> current $i_{ref}$ is thus dependent on the sum of the reference memory cell currents. The reference current $i_{ref}$ from the reference bit line BL<ref> is input as a feedback signal to the word line control circuit 18 for the purpose of modulating the pulse width of the generated word line signals 16 to account for cell drift. The number j of reference memory cells $14_{ref}$ that are included, as well as the programming levels for the reference memory cells $14_{ref}$, is selected to compensate for the drift effect of the array memory cells $14_{mn}$ representing a reasonable statistic and as a state distribution.

Figure 4A:
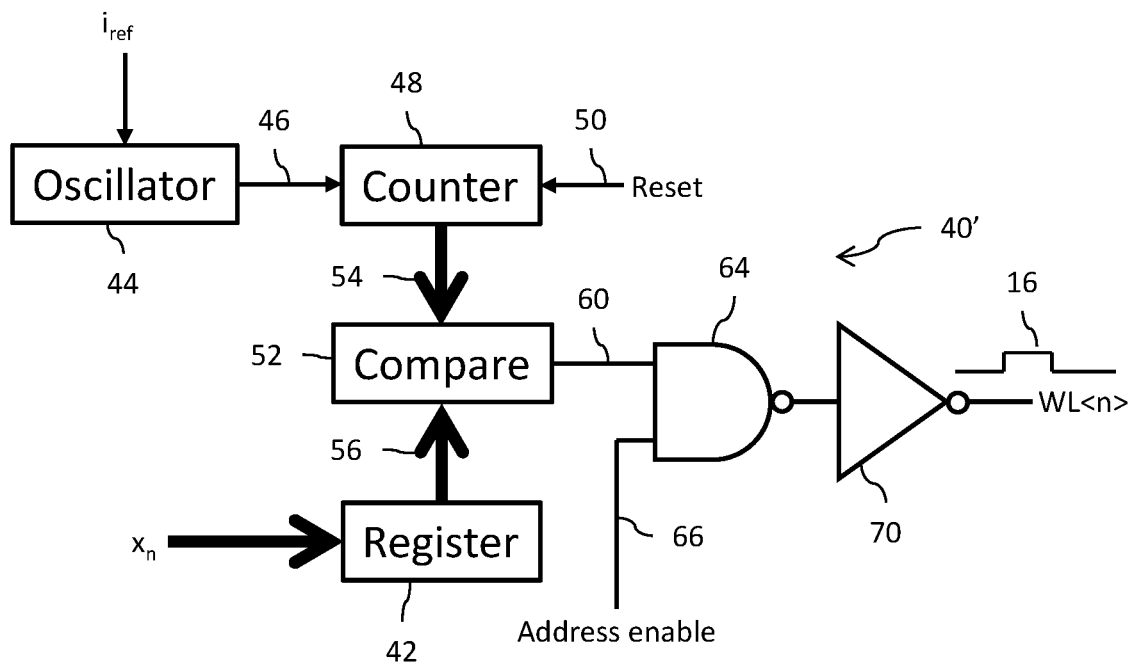
FIGS. 4A and 4B show circuit diagrams for timing control circuits used for word line signal control in the circuit of FIG. 3.

FIG. 4A shows an embodiment for a digital timing control circuit 40' within the word line control circuit 18 to generate the word line signal 16 from the multi-bit digital signal x for a given word line WL. Like references in FIGS. 2A and 4A refer to like or similar components whose description will not be repeated here for sake of brevity. The circuit 40' of FIG. 4A differs from the circuit 40 of FIG. 2A in that the reference current $i_{ref}$ from the reference bit line BL<ref> is input as feedback to the oscillator 44 in order to modulate the frequency of the clock signal 46. The effect of this modulation is to change the rate at which the counter circuit 48 incrementally changes the count value 54. As a result, there is a change in the timing location for the trailing edge of the pulse in the word line signal 16 to account and compensate for cell drift. As an example, if the memory cells 14 experience a drift to become less conductive when programmed in the crystalline phase (i.e., $g_{mn}$ decreases), the feedback provided by the reference current $i_{ref}$ from the reference bit line BL<ref> will cause a decrease in the frequency of the clock signal 46 generated by the oscillator 44 with a corresponding increase in the word line signal 16 pulse width. Conversely, if the memory cells 14 experience a drift to become more conductive when programmed in the crystalline phase (i.e., $g_{mn}$ increases), the feedback provided by the reference current $i_{ref}$ from the reference bit line BL<ref> will cause an increase in the frequency of the clock signal 46 generated by the oscillator 44 with a corresponding decrease in the word line signal 16 pulse width.

Figure 5A:
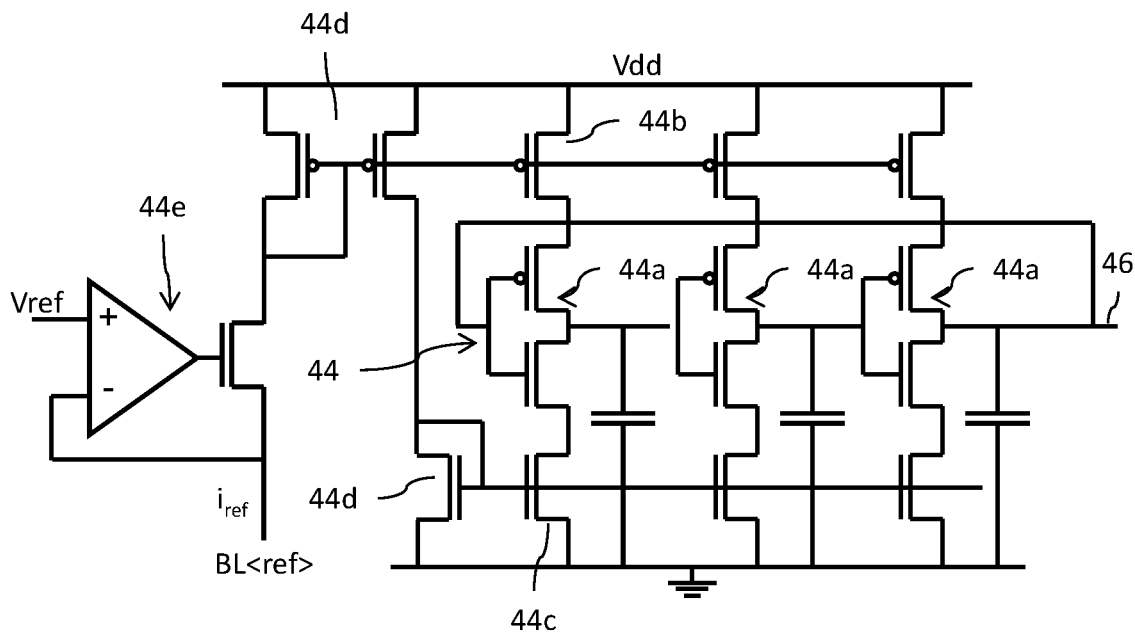
FIG. 5A is a circuit diagram for an oscillator circuit with frequency feedback control for drift compensation.

FIG. 5A shows a circuit diagram for an embodiment of the oscillator 44 having a frequency modulated in response to feedback from the reference current $i_{ref}$ of the reference bit line BL<ref>. A voltage regulator circuit $44e$ of the low drop-out (LDO) type (which may be implement, by example, with a differential amplifier and transistor with feedback) receives a reference voltage Vref and regulates the voltage on the reference bit line BL<ref> to match Vref. The oscillator 44 is a current controlled oscillator (CCO) circuit formed by a plurality (i.e., odd number) of series connected inverter circuits $44a$ connected in a feedback loop. The positive current biasing transistors $44b$ and negative current biasing transistors $44c$ are connected through a current mirroring circuit $44d$ to be controlled by the reference current $i_{ref}$ from the reference bit line BL<ref>.

For the digital timing control solution which modulates the frequency of the clock signal 46 generated by the oscillator 44, one may consider the following equations as describing the compensation operation and the generation of the compensated word line signals 16:

$$Q_{out,m} = V_{ref} \sum_{i=1}^{n} g_{m,i} T_{on,i}$$

$$Q_{ref} = V_{ref} \sum_{i=1}^{j} g_{ref} x_{max} T_{CK}$$

$$T_{on,i} = x_i T_{CK}$$

$$y_m = \frac{Q_{out,m}}{Q_{ref}} = \frac{1}{j} \sum_{i=1}^{n} \frac{x_i}{x_{max}} \frac{g_{m,i}}{g_{ref}}$$

Where: $Q_{out,m}$ is the total charge of the m-th bit line column; $Q_{ref}$ is the total charge of the reference memory cells; $g_{m,i}$ is the transconductance of the memory cell; $g_{ref}$ is the mean transconductance of reference cells; j is the number of reference cells; $T_{CK}$ is the period of the clock signal output from the oscillator; Vref is the reference voltage for the bit lines BL; $T_{on}$ is the width of the word line signal pulse applied to the selected word line in response to the digital input value $x_i$; $x_{max}$ is the maximum value of each input $x_i$.

Figure 4B:
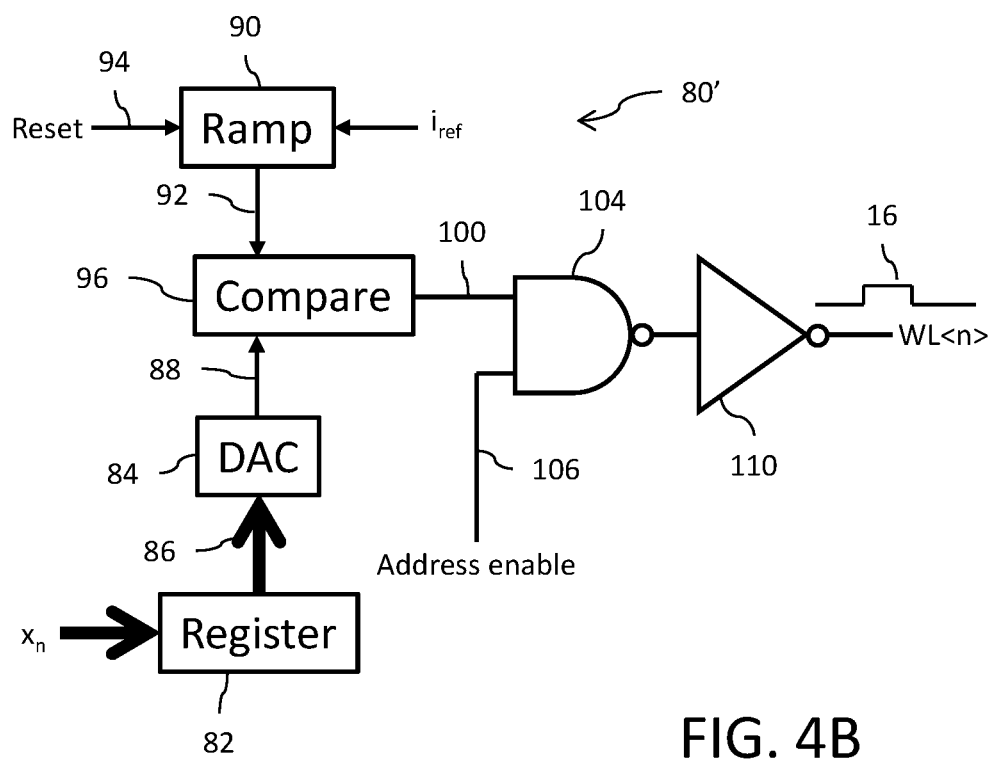

FIG. 4B shows an embodiment for an analog timing control circuit 80' within the word line control circuit 18 to generate the word line signal 16 from the multi-bit digital signal x for a given word line WL. Like references in FIGS. 2B and 4B refer to like or similar components whose description will not be repeated here for sake of brevity. The circuit 80' of FIG. 4B differs from the circuit 80 of FIG. 2B in that the reference current $i_{ref}$ from the reference bit line BL<ref> is input as feedback to the ramp generator 90 in order to modulate the slope of the ramp signal 92. As a result, there is a change in the timing location for the trailing edge of the pulse in the word line signal 16 to account and compensate for cell drift. As an example, if the memory cells 14 experience a drift to become less conductive when programmed in the crystalline phase (i.e., $g_{mn}$ decreases), the feedback provided by the reference current $i_{ref}$ from the reference bit line BL<ref> will cause a decrease in the slope of the ramp signal 92 output by the ramp generator 90 with a corresponding increase in the word line signal 16 pulse width. Conversely, if the memory cells 14 experience a drift to become more conductive when programmed in the crystalline phase (i.e., $g_{mn}$ increases), the feedback provided by the reference current $i_{ref}$ from the reference bit line BL<ref> will cause an increase in the slope of the ramp signal 92 output by the ramp generator 90 with a corresponding decrease in the word line signal 16 pulse width.

Figure 5B:
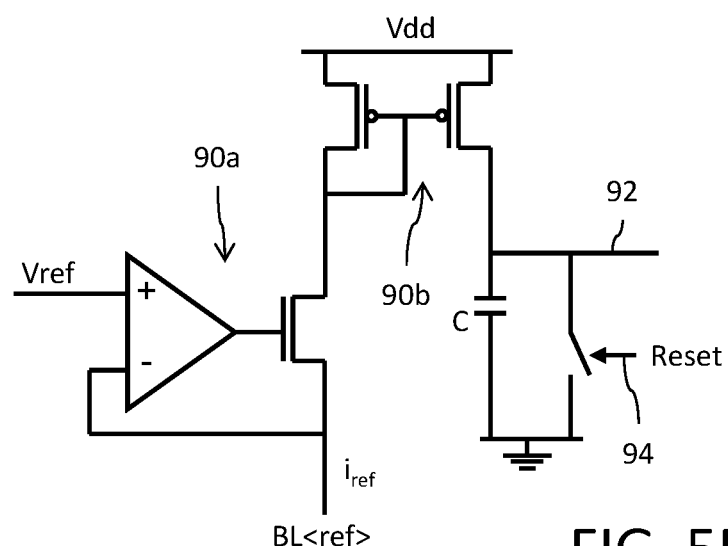
FIG. 5B is a circuit diagram for a ramp generator with slope feedback control for drift compensation.

FIG. 5B shows a circuit diagram for an embodiment of the ramp generator 90 having a slope modulated in response to feedback from the reference current $i_{ref}$ of the reference bit line BL<ref>. The ramp generator 90 includes a voltage regulator circuit $90a$ of the low drop-out (LDO) type (which may be implement, by example, with a differential amplifier and transistor with feedback) that receives a reference voltage Vref and regulates the voltage on the reference bit line BL<ref> to match Vref. The reference current $i_{ref}$ on the reference bit line BL<ref> is mirrored by a current mirroring circuit 90b and applied as a current to charge a capacitor C and generate a voltage ramp for the ramp signal 92. A switch circuit is coupled in parallel with the capacitor C and is controlled by the reset signal 94.

For the analog timing control solution which modulates the slope of the ramp signal 92, one may consider the following equations as describing the compensation operation and the generation of the compensated word line signal 16:

$$Q_{out,m} = V_{ref} \sum_{i=1}^{n} g_{m,i} T_{on,i}$$

$$Q_{ref} = V_{ref} \sum_{i=1}^{j} g_{ref} T_{max}$$

$$T_{on,i} = \frac{x_i}{x_{max}} T_{max}$$

$$y_m = \frac{Q_{out,m}}{Q_{ref}} = \frac{1}{j} \sum_{i=1}^{n} \frac{x_i}{x_{max}} \frac{g_{m,i}}{g_{ref}}$$

Where: $Q_{out,m}$ is the total charge of the m-th bit line column; $Q_{ref}$ is the total charge of the reference memory cells; $g_{m,i}$ is the transconductance of the memory cell; $g_{ref}$ is the mean transconductance of reference cells; j is the number of reference cells; Vref is the reference voltage for the bit lines BL; $T_{on}$ is the width of the word line signal pulse applied to the selected word line in response to the digital input value $x_i$; $x_{max}$ is the maximum value of each input $x_i$; $T_{max}$ is the width of the word line signal pulse applied to the selected word line in response to the maximum digital input value $x_{max}$.

The multi-bit digital signal $x_n$ for the feature (or coefficient) data may include a bit which is indicative of a sign (either positive (+) or negative (−)) of the digital value. The in-memory compute operation should take that sign into account when performing multiply and accumulate.

Figure 6A:
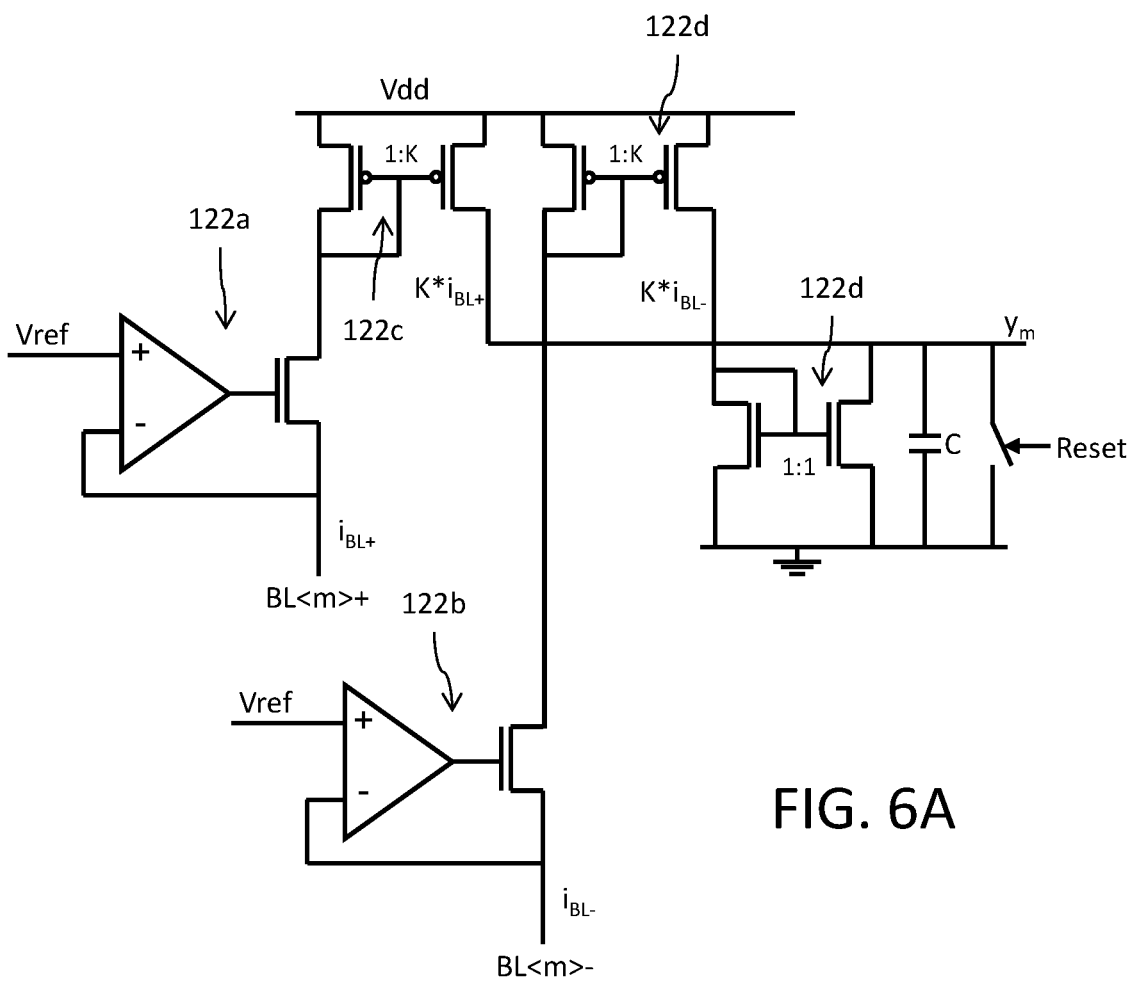
FIGS. 6A and 6B are schematic diagrams of an integration circuit for use in the circuit of FIG. 6.
Figure 6B:
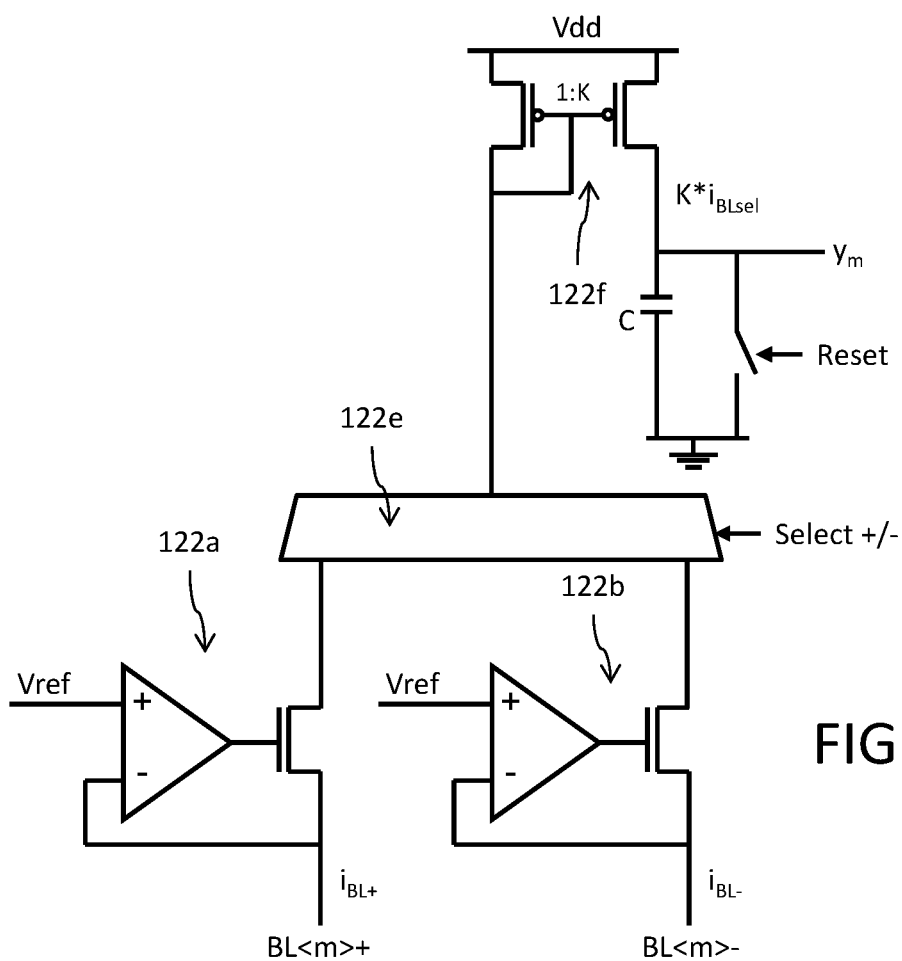
Figure 6:
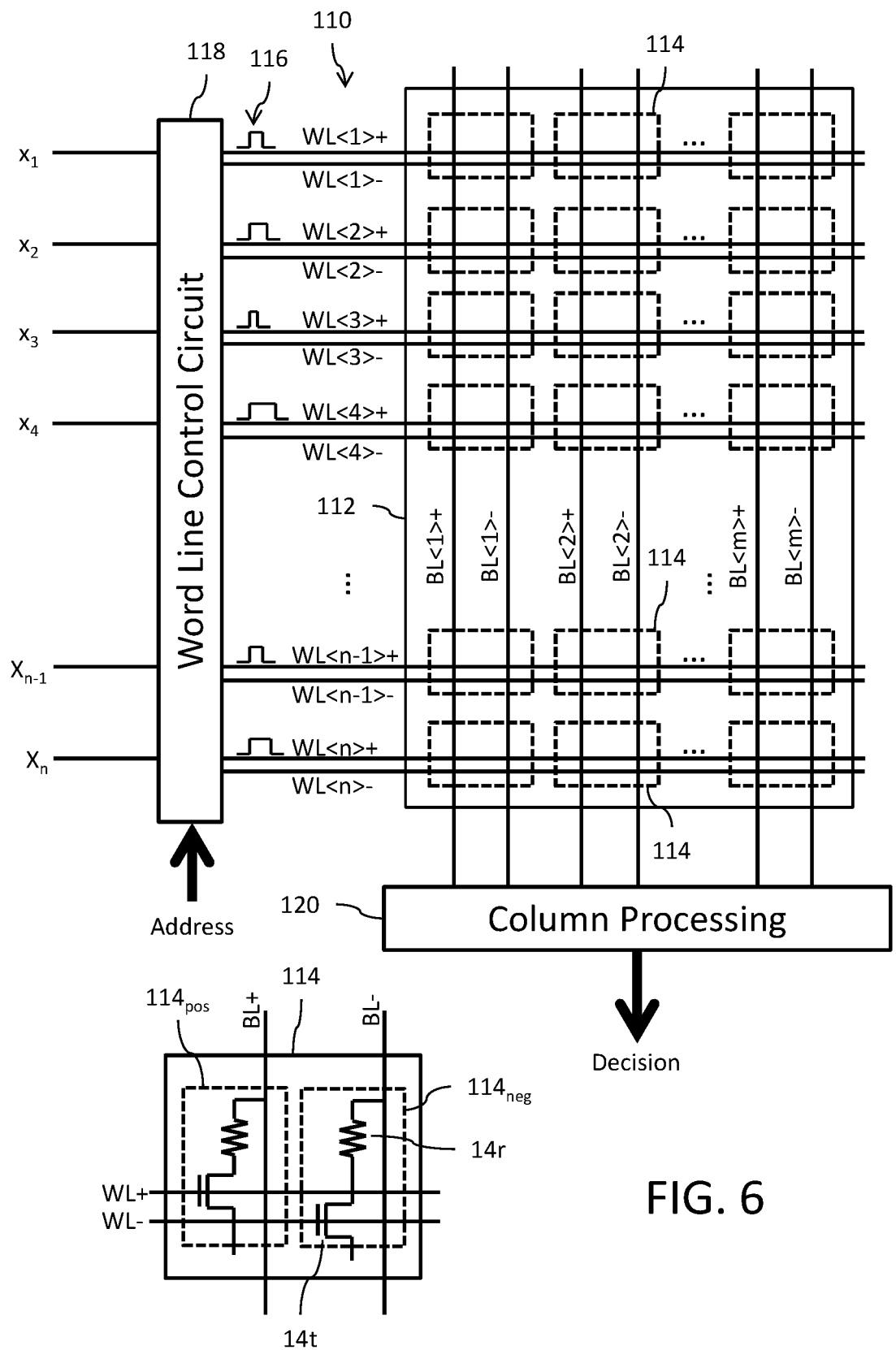
FIG. 6 is a schematic diagram of an in-memory computation circuit that can account for input signal sign.

Reference is now made to FIG. 6 which shows a schematic diagram of an in-memory computation circuit 110 that can account for input signal sign in performing multiply and accumulate. The circuit 110 utilizes a memory array 112 formed by a plurality of memory cells 14 arranged in a matrix format having n rows and m columns. Each memory cell 114 includes a positive sub-cell $114_{pos}$ and a negative sub-cell $114_{neg}$ that are programmed to store data $g_{mn}$ relating to the computational weights for an in-memory compute operation. Each memory cell 114 includes a positive word line WL+, a negative word line WL−, a positive bit line BL+ and a negative bit line BL−. The memory cells 114 in a common row of the matrix are connected to each other through the common word lines WL+ and WL−. More specifically, the positive sub-cells $114_{pos}$ in a common row of the matrix are connected to each other through the common positive word line WL+ and the negative sub-cells $114_{neg}$ in that common row of the matrix are connected to each other through the negative word line WL−. The memory cells 114 in a common column of the matrix are connected to each other through the common bit lines BL+ and BL−. More specifically, the positive sub-cells $114_{pos}$ in a common column of the matrix are connected to each other through the common positive bit line BL+ and the negative sub-cells $114_{neg}$ in that common column of the matrix are connected to each other through the negative bit line BL−.

The word lines WL<1>+, . . . , WL<n>+ and WL<1>−, . . . , WL<n>− are driven by a word line control circuit 118. The word line signals 116 applied to the word lines by the word line control circuit 118 are generated from feature (or coefficient) data x input to the in-memory computation circuit 110. This feature data may, for example, comprise a plurality of multi-bit digital signals $x_i$, . . . , $x_n$ that are processed by the word line control circuit 118 to generate the word line signals 116. In particular, each digital signal $x_n$ may include a sign bit whose logic state indicates whether the feature data is positive data or negative data. In the event that the sign bit is positive, then word line control circuit 118 will generate the corresponding word line signal 116 on the positive word line WL+(and the negative word line WL− is not actuated) which results in the generation of a current contribution having a charge function proportional to $(+)x_n \times g_{mn}$ on the positive bit line BL+. Conversely, if the sign bit is negative, then word line control circuit 118 will generate the corresponding word line signal 116 on the negative word line WL− (and the positive word line WL+ is not actuated) which results in the generation of a current contribution having a charge function proportional to $(-)x_n \times g_{mn}$ on the negative bit line BL−.

A column processing circuit 120 receives the analog signals on the positive and negative bit lines BL+ and BL− for the m columns and generates the multiply and accumulate (MAC) decision outputs y for the in-memory compute operation. The column processing circuit 120 may, for example, be implemented to integrate the analog signals on each of bit lines BL+ and BL− to generate the outputs $y_1$, . . . , $y_m$, and then further process a combination of those outputs $y_1$, . . . , $y_m$ to generate an overall output decision Y using a processing circuit. The processing circuit may include, for example, an analog-to-digital converter (ADC) circuit for each bit line BL (or pair of bit lines BL+, BL−) that functions to convert the integrated analog signal to a digital value, and a digital signal processing (DSP) circuit that functions to process the digital values output from the DACs.

An example integrator circuit for the column processing circuit 120 is shown in FIG. 6A. A first voltage regulator circuit 122a of the low drop-out (LDO) type (which may be implement, by example, with a differential amplifier and transistor with feedback) receives a reference voltage Vref and regulates the voltage on the positive bit line BL+ to match Vref. Likewise, a second voltage regulator circuit 122b of the low drop-out (LDO) type (which may be implemented, by example, with a differential amplifier and transistor with feedback) receives the reference voltage Vref and regulates the voltage on the negative bit line BL− to match Vref. The bit line current $i_{BL+}$ on the positive bit line BL+ is mirrored by a first current mirroring circuit 122c (with a mirroring ratio of 1:K) and applied as a sourced current $K*i_{BL+}$ to charge an integration capacitor C. The bit line current $i_{BL-}$ on the negative bit line BL− is mirrored by a second current mirroring circuit 122d (with a mirroring ratio of 1:K) and applied as a sunk current $K*i_{BL-}$ to discharge the integration capacitor C. The voltage developed across the capacitor C in response to the currents $K*i_{BL+}$ and $K*i_{BL-}$ generates the integrated output voltage y. A switch circuit coupled in parallel with the integration capacitor C discharges the capacitor in response to assertion of a reset signal. The integration value y is converted to a digital value by the ADC circuit to produce the y output.

An alternative example integrator circuit for the column processing circuit 120 is shown in FIG. 6B. A first voltage regulator circuit 122a of the low drop-out (LDO) type (which may be implemented, by example, with a differential amplifier and transistor with feedback) receives a reference voltage Vref and regulates the voltage on the positive bit line BL+ to match Vref. Likewise, a second voltage regulator circuit 122b of the low drop-out (LDO) type (which may be implemented, by example, with a differential amplifier and transistor with feedback) receives the reference voltage Vref and regulates the voltage on the negative bit line BL− to match Vref. The bit line current $i_{BL+}$ on the positive bit line BL+ is applied as a first input to a column multiplexing circuit 122e and the bit line current $i_{BL-}$ on the negative bit line BL− is applied as a second input to a column multiplexing circuit 122e. The current $i_{BLsel}$ output from the column multiplexing circuit 122e is mirrored by a current mirroring circuit 122f (with a mirroring ratio of 1:K) and applied as a current $K*i_{BLsel}$ to charge an integration capacitor C and generate the integrated output voltage y. A switch circuit coupled in parallel with the integration capacitor C discharges the capacitor in response to assertion of a reset signal. The operation for integration here is performed in two steps. In a first step, the column multiplexing circuit 122e selects the bit line current $i_{BL+}$ on the positive bit line BL+ for integration on the capacitor C to produce a positive integration value y+. Next, in a second step, the column multiplexing circuit 122e selects the bit line current $i_{BL-}$ on the negative bit line BL− for integration on the capacitor C to produce a negative integration value y−. The positive and negative integration values y+ and y− are each converted to corresponding positive and negative digital values by the ADC circuit and combined in the digital domain by the DSP circuit to produce the y output.

It will be understood that other memory cell types could instead be used for the array 112. For example, magnetoresistive random access memory (MRAM) cells or resistive random access memory (RRAM) cells could be used.

Although not specifically shown in FIG. 6, it will be understood that the implementation of the circuit 110 may include the drift compensation functionality as shown in FIG. 3 and described herein.

It is also possible for the data $g_{mn}$ relating to the computational weights to have a sign (either positive (+) or negative (−)). The in-memory compute operation should take that sign into account when performing multiply and accumulate.

Figure 7:
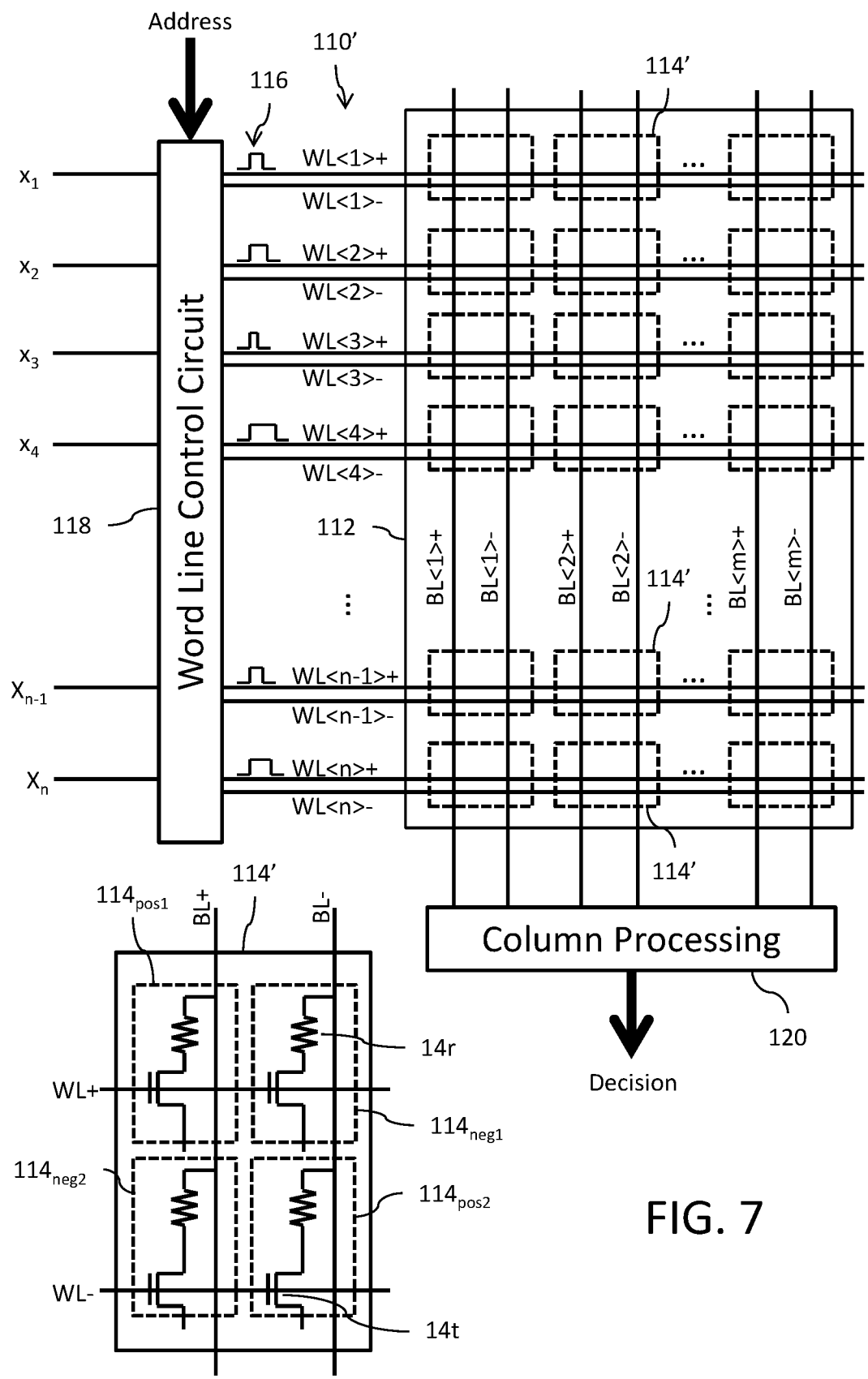
FIG. 7 is a schematic diagram of an in-memory computation circuit that can account for input signal sign and coefficient weight sign.

Reference is now made to FIG. 7 which shows a schematic diagram of an in-memory computation circuit 110' that can account for both input signal sign and computational weight sign in performing multiply and accumulate. Like references in FIGS. 6 and 7 refer to like or similar parts the description of which will not be provided for sake of brevity. The circuit 110' of FIG. 7 differs from the circuit 110 of FIG. 6 primarily in the configuration of each memory cell 114'. Here, each memory cell 114' includes a first positive sub-cell $114_{pos1}$ and a second positive sub-cell $114_{pos2}$ that are programmed to store data $g_{mn}$ relating to the positive computational weights for an in-memory compute operation, and further includes a first negative sub-cell $114_{neg1}$ and a second negative sub-cell $114_{neg2}$ that are programmed to store data $g_{mn}$ relating to the negative computational weights for the in-memory compute operation. Each memory cell 114 includes a positive word line WL+, a negative word line WL−, a positive bit line BL+ and a negative bit line BL−. The memory cells 114' in a common row of the matrix are connected to each other through the common word lines WL+ and WL−. More specifically, the first positive sub-cells $114_{pos1}$ and first negative sub-cells $114_{neg1}$ in a common row of the matrix are connected to each other through the common positive word line WL+ and the second negative sub-cells $114_{neg2}$ and second positive sub-cells $114_{pos2}$ in that common row of the matrix are connected to each other through the negative word line WL−. The memory cells 114' in a common column of the matrix are connected to each other through the common bit lines BL+ and BL−. More specifically, the first positive sub-cells $114_{pos1}$ and second negative sub-cells $114_{neg2}$ in a common column of the matrix are connected to each other through the common positive bit line BL+ and the first negative sub-cells $114_{neg1}$ and second positive sub-cells $114_{pos2}$ in that common column of the matrix are connected to each other through the negative bit line BL−. When a given memory cell 114' is being programmed with a positive computational weight for the in-memory compute operation, the first positive sub-cell $114_{pos1}$ and the second positive sub-cell $114_{pos2}$ are both programmed at one of the multilevel states, while the first negative sub-cell $114_{neg1}$ and the second negative sub-cell $114_{neg2}$ are programmed in the reset state. Conversely, when that given memory cell 114' is instead being programmed with a negative computational weight for the in-memory compute operation, the first negative sub-cell $114_{neg1}$ and the second negative sub-cell $114_{neg2}$ are both programmed at one of the multilevel states, while the first positive sub-cell $114_{pos1}$ and the second positive sub-cell $114_{pos2}$ are programmed in the reset state.

The word lines WL<1>+, . . . , WL<n>+ and WL<1>−, . . . , WL<n>− are driven by a word line control circuit 118. The word line signals 116 applied to the word lines by the word line control circuit 118 are generated from feature (or coefficient) data x input to the in-memory computation circuit 110. This feature data may, for example, comprise a plurality of multi-bit digital signals $x_i, \ldots, x_n$ that are processed by the word line control circuit 118 to generate the word line signals 116. In particular, each digital signal $x_n$ may include a sign bit whose logic state indicates whether the feature data is positive data or negative data. In the event that the sign bit is positive, then word line control circuit 118 will generate the corresponding word line signal 116 on the positive word line WL+ (and the negative word line WL− is not actuated). This word line signal 116 on the positive word line WL+ is applied to the gate terminals of the select transistors for the first positive sub-cells $114_{pos1}$ and first negative sub-cells $114_{neg1}$ of the row (resulting in the generation of a current contribution with a charge function proportional to $(+)x_n \times (+)g_{mn}$ on the positive bit line BL+ if the first positive sub-cell $114_{pos1}$ is in the set state or the generation of a current contribution with a charge function proportional to $(+)x_n \times (-)g_{mn}$ on the negative bit line BL− if first negative sub-cell $114_{neg1}$ is in the set state). Conversely, if the sign bit is negative, then word line control circuit 118 will generate the corresponding word line signal 116 on the negative word line WL− (and the positive word line WL+ is not actuated). This word line signal 116 on the negative word line WL+ is applied to the gate terminals of the select transistors for the second negative sub-cells $114_{neg2}$ and second positive sub-cells $114_{pos2}$ of the row (resulting in the generation of a current contribution having a charge function proportional to $(-)x_n \times (-)g_{mn}$ on the positive bit line BL+ if the second negative sub-cell $114_{neg2}$ is in the set state or the generation of a current contribution having a charge function proportional to $(-)x_n \times (+)g_{mn}$ on the negative bit line BL− if second positive sub-cell $114_{pos2}$ is in the set state).

A column processing circuit 120 receives the analog signals on the positive and negative bit lines BL+ and BL− for the m columns and generates the multiply and accumulate (MAC) decision outputs y for the in-memory compute operation. The column processing circuit 120 may, for example, be implemented to integrate the analog signals on each of bit lines BL+ and BL− to generate the outputs $y_1, \ldots, y_m$, and then further process a combination of those outputs $y_1, \ldots, y_m$ to generate an overall output decision Y using a processing circuit. The processing circuit may include, for example, an analog-to-digital converter (ADC) circuit for each bit line BL (or pair of bit lines BL+, BL−) that functions to convert the integrated analog signal to a digital value, and a digital signal processing (DSP) circuit that functions to process the digital values output from the DACs.

It will be understood that other memory cell types could instead be used for the array 112. For example, magnetoresistive random access memory (MRAM) cells or resistive random access memory (RRAM) cells could be used.

Although not specifically shown in FIG. 7, it will be understood that the implementation of the circuit 110' may include the drift compensation functionality as shown in FIG. 3 and described herein.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An in-memory computation circuit, comprising:
a memory array including a plurality of memory cells arranged in a matrix with plural rows and plural columns, each row including a first word line connected to the memory cells of the row, and each column including a first bit line connected to the memory cells of the column, wherein computational weights for an in-memory compute operation are stored in the memory cells;
a word line control circuit configured to simultaneously actuate the plurality of first word lines in response to input signals providing coefficient data for said in-memory compute operation by applying word line signal pulses to the first word lines; and
a column processing circuit connected to the first bit lines and configured to process analog signals developed on the first bit lines in response to the simultaneous actuation of the plurality of first word lines to generate multiply and accumulate output signals for said in-memory compute operation,
wherein:
the memory array further includes a plurality of reference memory cells connected to a reference word line to receive a reference word line signal pulse and connected to a reference bit line; and
the word line control circuit is further configured to modulate pulse widths of the word line signal pulses in response to an analog reference signal developed on the reference bit line in response to the actuation of the reference word line by the reference word line signal pulse.

2. An in-memory computation circuit, comprising:
a memory array including a plurality of memory cells arranged in a matrix with plural rows and plural columns, each row including a first word line connected to the memory cells of the row, and each column including a first bit line connected to the memory cells of the column, wherein computational weights for an in-memory compute operation are stored in the memory cells;
a word line control circuit configured to simultaneously actuate the plurality of first word lines in response to input signals providing coefficient data for said in-memory compute operation by applying word line signal pulses to the first word lines; and
a column processing circuit connected to the first bit lines and configured to process analog signals developed on the first bit lines in response to the simultaneous actuation of the plurality of first word lines to generate multiply and accumulate output signals for said in-memory compute operation;
wherein the column processing circuit comprises:
a voltage regulator for each column configured to regulate a voltage applied to the first bit line; and
an integrator circuit configured to integrate a current of the analog signal that is developed on the first bit line.

3. The in-memory computation circuit of claim 2, further comprising a reset circuit configured to reset the integrator circuit at a beginning of the in-memory compute operation.

4. The in-memory computation circuit of claim 2, wherein the integrator circuit comprises a current mirror configured to mirror the current of the analog signal to charge an integration capacitor.

5. The in-memory computation circuit of claim 1, wherein the modulation of the pulse widths of the word line signal pulses compensates for drift in the plurality of memory cells.

6. The in-memory computation circuit of claim 1, wherein the pulse widths of the word line signal pulses are proportional to coefficient data values of the input signals, and wherein proportionality is dependent on the analog reference signal.

7. The in-memory computation circuit of claim 6, wherein the analog reference signal controls a frequency of a clock signal driving a counter circuit, and proportionality is dependent on a digital comparison of the input signal coefficient data value to a counter value.

8. The in-memory computation circuit of claim 6, wherein the analog reference signal controls a slope of a ramp signal, and proportionality is dependent on an analog comparison of the input signal coefficient data value to a ramp signal.

9. The in-memory computation circuit of claim 6, wherein reference word line signal pulse has a pulse width at least equal to a maximum pulse width of the word line signal pulses applied to the first word lines.

10. The in-memory computation circuit of claim 1, wherein each row includes the first word line and a second word line connected to the memory cells of the row, and each column includes the first bit line and a second bit line connected to the memory cells of the column;
wherein each memory cell comprises:
a first sub-cell connected to the first bit line and the first word line; and
a second sub-cell connected to the second bit line and the second word line; and
wherein the first word line is asserted with the word line signal pulse if the input signal coefficient data value has a positive sign and the second word line is asserted with the word line signal pulse if the input signal coefficient data value has a negative sign.

11. An in-memory computation circuit, comprising:
a memory array including a plurality of memory cells arranged in a matrix with plural rows and plural columns, each row including a first word line connected to the memory cells of the row, and each column including a first bit line connected to the memory cells of the column, wherein computational weights for an in-memory compute operation are stored in the memory cells;
a word line control circuit configured to simultaneously actuate the plurality of first word lines in response to input signals providing coefficient data for said in-memory compute operation by applying word line signal pulses to the first word lines; and
a column processing circuit connected to the first bit lines and configured to process analog signals developed on the first bit lines in response to the simultaneous actuation of the plurality of first word lines to generate multiply and accumulate output signals for said in-memory compute operation;
wherein each row includes the first word line and a second word line connected to the memory cells of the row, and each column includes the first bit line and a second bit line connected to the memory cells of the column;
wherein each memory cell comprises:
a first sub-cell connected to the first bit line and the first word line; and
a second sub-cell connected to the second bit line and the second word line; and
wherein the first word line is asserted with the word line signal pulse if the input signal coefficient data value has a positive sign and the second word line is asserted with the word line signal pulse if the input signal coefficient data value has a negative sign;
wherein the column processing circuit comprises:
a first voltage regulator for each column configured to regulate a voltage applied to the first bit line;
a second voltage regulator for each column configured to regulate a voltage applied to the second bit line; and
an integrator circuit configured to positively integrate a current of the analog signal that is developed on the first bit line and negatively integrate a current of the analog signal that is developed on the second bit line.

12. An in-memory computation circuit, comprising:
a memory array including a plurality of memory cells arranged in a matrix with plural rows and plural columns, each row including a first word line connected to the memory cells of the row, and each column including a first bit line connected to the memory cells of the column, wherein computational weights for an in-memory compute operation are stored in the memory cells;
a word line control circuit configured to simultaneously actuate the plurality of first word lines in response to input signals providing coefficient data for said in-memory compute operation by applying word line signal pulses to the first word lines; and
a column processing circuit connected to the first bit lines and configured to process analog signals developed on the first bit lines in response to the simultaneous actuation of the plurality of first word lines to generate multiply and accumulate output signals for said in-memory compute operation;
wherein each row includes the first word line and a second word line connected to the memory cells of the row, and each column includes the first bit line and a second bit line connected to the memory cells of the column;
wherein each memory cell comprises:
a first sub-cell connected to the first bit line and the first word line; and
a second sub-cell connected to the second bit line and the second word line; and
wherein the first word line is asserted with the word line signal pulse if the input signal coefficient data value has a positive sign and the second word line is asserted with the word line signal pulse if the input signal coefficient data value has a negative sign;
wherein the column processing circuit comprises:
a first voltage regulator for each column configured to regulate a voltage applied to the first bit line;
a second voltage regulator for each column configured to regulate a voltage applied to the second bit line;
a multiplexer configured to select a current of the analog signal that is developed on the first bit line in a first step and select a current of the analog signal that is developed on the second bit line in a second step; and
an integrator circuit configured to integrate the selected current in the first step and integrate the selected current in the second step.

13. The in-memory computation circuit of claim 1, wherein each column includes the first bit line and a second bit line connected to the memory cells of the column;
wherein each memory cell comprises:
a first sub-cell connected to the first bit line and the first word line; and
a second sub-cell connected to the second bit line and the first word line; and
wherein the first sub-cell is set and the second sub-cell is reset if the computational weight has a positive sign and the first sub-cell is reset and the second sub-cell is set if the computational weight has a negative sign.

14. An in-memory computation circuit, comprising:
a memory array including a plurality of memory cells arranged in a matrix with plural rows and plural columns, each row including a first word line connected to the memory cells of the row, and each column including a first bit line connected to the memory cells of the column, wherein computational weights for an in-memory compute operation are stored in the memory cells;
a word line control circuit configured to simultaneously actuate the plurality of first word lines in response to input signals providing coefficient data for said in-memory compute operation by applying word line signal pulses to the first word lines; and
a column processing circuit connected to the first bit lines and configured to process analog signals developed on the first bit lines in response to the simultaneous actuation of the plurality of first word lines to generate multiply and accumulate output signals for said in-memory compute operation;
wherein each column includes the first bit line and a second bit line connected to the memory cells of the column;
wherein each memory cell comprises:
a first sub-cell connected to the first bit line and the first word line; and
a second sub-cell connected to the second bit line and the first word line; and wherein the first sub-cell is set and the second sub-cell is reset if the computational weight has a positive sign and the first sub-cell is reset and the second sub-cell is set if the computational weight has a negative sign;

wherein the column processing circuit comprises:
a first voltage regulator for each column configured to regulate a voltage applied to the first bit line;
a second voltage regulator for each column configured to regulate a voltage applied to the second bit line; and
an integrator circuit configured to positively integrate a current of the analog signal that is developed on the first bit line and negatively integrate a current of the analog signal that is developed on the second bit line.

15. An in-memory computation circuit, comprising:
a memory array including a plurality of memory cells arranged in a matrix with plural rows and plural columns, each row including a first word line connected to the memory cells of the row, and each column including a first bit line connected to the memory cells of the column, wherein computational weights for an in-memory compute operation are stored in the memory cells;
a word line control circuit configured to simultaneously actuate the plurality of first word lines in response to input signals providing coefficient data for said in-memory compute operation by applying word line signal pulses to the first word lines; and
a column processing circuit connected to the first bit lines and configured to process analog signals developed on the first bit lines in response to the simultaneous actuation of the plurality of first word lines to generate multiply and accumulate output signals for said in-memory compute operation;
wherein each column includes the first bit line and a second bit line connected to the memory cells of the column;
wherein each memory cell comprises:
a first sub-cell connected to the first bit line and the first word line; and
a second sub-cell connected to the second bit line and the first word line; and
wherein the first sub-cell is set and the second sub-cell is reset if the computational weight has a positive sign and the first sub-cell is reset and the second sub-cell is set if the computational weight has a negative sign;
wherein the column processing circuit comprises:
a first voltage regulator for each column configured to regulate a voltage applied to the first bit line;
a second voltage regulator for each column configured to regulate a voltage applied to the second bit line;
a multiplexer configured to select a current of the analog signal that is developed on the first bit line in a first step and select a current of the analog signal that is developed on the second bit line in a second step; and
an integrator circuit configured to integrate the selected current in the first step and integrate the selected current in the second step.

16. An in-memory computation circuit, comprising:
a memory array including a plurality of memory cells arranged in a matrix with plural rows and plural columns, each row including a first word line connected to the memory cells of the row, and each column including a first bit line connected to the memory cells of the column, wherein computational weights for an in-memory compute operation are stored in the memory cells;
a word line control circuit configured to simultaneously actuate the plurality of first word lines in response to input signals providing coefficient data for said in-memory compute operation by applying word line signal pulses to the first word lines; and
a column processing circuit connected to the first bit lines and configured to process analog signals developed on the first bit lines in response to the simultaneous actuation of the plurality of first word lines to generate multiply and accumulate output signals for said in-memory compute operation;
wherein each row includes the first word line and a second word line connected to the memory cells of the row, and each column includes the first bit line and a second bit line connected to the memory cells of the column;
wherein each memory cell comprises:
a first sub-cell connected to the first bit line and the first word line;
a second sub-cell connected to the second bit line and the first word line;
a third sub-cell connected to the first bit line and the second word line; and
a fourth sub-cell connected to the second bit line and the second word line;
wherein the first word line is asserted with the word line signal pulse if the input signal coefficient data value has a positive sign and the second word line is asserted with the word line signal pulse if the input signal coefficient data value has a negative sign; and
wherein the first and fourth sub-cells are set and the second and third sub-cells are reset if the computational weight has a positive sign and the first and fourth sub-cells are reset and the second and third sub-cells are set if the computational weight has a negative sign.

17. The in-memory computation circuit of claim 16, wherein the column processing circuit comprises:
a first voltage regulator for each column configured to regulate a voltage applied to the first bit line;
a second voltage regulator for each column configured to regulate a voltage applied to the second bit line; and
an integrator circuit configured to positively integrate a current of the analog signal that is developed on the first bit line and negatively integrate a current of the analog signal that is developed on the second bit line.

18. The in-memory computation circuit of claim 17, wherein the column processing circuit comprises:
a first voltage regulator for each column configured to regulate a voltage applied to the first bit line;
a second voltage regulator for each column configured to regulate a voltage applied to the second bit line;
a multiplexer configured to select a current of the analog signal that is developed on the first bit line in a first step and select a current of the analog signal that is developed on the second bit line in a second step; and
an integrator circuit configured to integrate the selected current in the first step and integrate the selected current in the second step.

19. The in-memory computation circuit of claim 16, wherein:
the memory array further includes a plurality of reference memory cells connected to a reference word line to receive a reference word line signal pulse and connected to a reference bit line; and the word line control circuit is further configured to modulate pulse widths of the word line signal pulses in response to an analog reference signal developed on the reference bit line in response to the actuation of the reference word line by the reference word line signal pulse.

20. The in-memory computation circuit of claim 19, wherein the modulation of the pulse widths of the word line signal pulses compensates for drift in the plurality of memory cells.

21. The in-memory computation circuit of claim 19, wherein the pulse widths of the word line signal pulses are proportional to coefficient data values of the input signals, and wherein proportionality is dependent on the analog reference signal.

22. The in-memory computation circuit of claim 21, wherein the analog reference signal controls a frequency of a clock signal driving a counter circuit, and proportionality is dependent on a digital comparison of the input signal coefficient data value to a counter value.

23. The in-memory computation circuit of claim 21, wherein the analog reference signal controls a slope of a ramp signal, and proportionality is dependent on an analog comparison of the input signal coefficient data value to a ramp signal.

24. The in-memory computation circuit of claim 21, wherein reference word line signal pulse has a pulse width at least equal to a maximum pulse width of the word line signal pulses applied to the first word lines.

25. The in-memory computation circuit of claim 2, wherein:
the memory array further includes a plurality of reference memory cells connected to a reference word line to receive a reference word line signal pulse and connected to a reference bit line; and
the word line control circuit is further configured to modulate pulse widths of the word line signal pulses in response to an analog reference signal developed on the reference bit line in response to the actuation of the reference word line by the reference word line signal pulse.

26. The in-memory computation circuit of claim 25, wherein the modulation of the pulse widths of the word line signal pulses compensates for drift in the plurality of memory cells.

27. The in-memory computation circuit of claim 25, wherein the pulse widths of the word line signal pulses are proportional to coefficient data values of the input signals, and wherein proportionality is dependent on the analog reference signal.

28. The in-memory computation circuit of claim 27, wherein the analog reference signal controls a frequency of a clock signal driving a counter circuit, and proportionality is dependent on a digital comparison of the input signal coefficient data value to a counter value.

29. The in-memory computation circuit of claim 27, wherein the analog reference signal controls a slope of a ramp signal, and proportionality is dependent on an analog comparison of the input signal coefficient data value to a ramp signal.

30. The in-memory computation circuit of claim 27, wherein reference word line signal pulse has a pulse width at least equal to a maximum pulse width of the word line signal pulses applied to the first word lines.

31. The in-memory computation circuit of claim 11, wherein:
the memory array further includes a plurality of reference memory cells connected to a reference word line to receive a reference word line signal pulse and connected to a reference bit line; and
the word line control circuit is further configured to modulate pulse widths of the word line signal pulses in response to an analog reference signal developed on the reference bit line in response to the actuation of the reference word line by the reference word line signal pulse.

32. The in-memory computation circuit of claim 31, wherein the modulation of the pulse widths of the word line signal pulses compensates for drift in the plurality of memory cells.

33. The in-memory computation circuit of claim 31, wherein the pulse widths of the word line signal pulses are proportional to coefficient data values of the input signals, and wherein proportionality is dependent on the analog reference signal.

34. The in-memory computation circuit of claim 33, wherein the analog reference signal controls a frequency of a clock signal driving a counter circuit, and proportionality is dependent on a digital comparison of the input signal coefficient data value to a counter value.

35. The in-memory computation circuit of claim 33, wherein the analog reference signal controls a slope of a ramp signal, and proportionality is dependent on an analog comparison of the input signal coefficient data value to a ramp signal.

36. The in-memory computation circuit of claim 33, wherein reference word line signal pulse has a pulse width at least equal to a maximum pulse width of the word line signal pulses applied to the first word lines.

37. The in-memory computation circuit of claim 12, wherein:
the memory array further includes a plurality of reference memory cells connected to a reference word line to receive a reference word line signal pulse and connected to a reference bit line; and
the word line control circuit is further configured to modulate pulse widths of the word line signal pulses in response to an analog reference signal developed on the reference bit line in response to the actuation of the reference word line by the reference word line signal pulse.

38. The in-memory computation circuit of claim 37, wherein the modulation of the pulse widths of the word line signal pulses compensates for drift in the plurality of memory cells.

39. The in-memory computation circuit of claim 37, wherein the pulse widths of the word line signal pulses are proportional to coefficient data values of the input signals, and wherein proportionality is dependent on the analog reference signal.

40. The in-memory computation circuit of claim 39, wherein the analog reference signal controls a frequency of a clock signal driving a counter circuit, and proportionality is dependent on a digital comparison of the input signal coefficient data value to a counter value.

41. The in-memory computation circuit of claim 39, wherein the analog reference signal controls a slope of a ramp signal, and proportionality is dependent on an analog comparison of the input signal coefficient data value to a ramp signal.

42. The in-memory computation circuit of claim 39, wherein reference word line signal pulse has a pulse width at least equal to a maximum pulse width of the word line signal pulses applied to the first word lines.

43. The in-memory computation circuit of claim 14, wherein:
the memory array further includes a plurality of reference memory cells connected to a reference word line to receive a reference word line signal pulse and connected to a reference bit line; and
the word line control circuit is further configured to modulate pulse widths of the word line signal pulses in response to an analog reference signal developed on the reference bit line in response to the actuation of the reference word line by the reference word line signal pulse.

44. The in-memory computation circuit of claim 43, wherein the modulation of the pulse widths of the word line signal pulses compensates for drift in the plurality of memory cells.

45. The in-memory computation circuit of claim 43, wherein the pulse widths of the word line signal pulses are proportional to coefficient data values of the input signals, and wherein proportionality is dependent on the analog reference signal.

46. The in-memory computation circuit of claim 45, wherein the analog reference signal controls a frequency of a clock signal driving a counter circuit, and proportionality is dependent on a digital comparison of the input signal coefficient data value to a counter value.

47. The in-memory computation circuit of claim 45, wherein the analog reference signal controls a slope of a ramp signal, and proportionality is dependent on an analog comparison of the input signal coefficient data value to a ramp signal.

48. The in-memory computation circuit of claim 45, wherein reference word line signal pulse has a pulse width at least equal to a maximum pulse width of the word line signal pulses applied to the first word lines.

49. The in-memory computation circuit of claim 15, wherein:
the memory array further includes a plurality of reference memory cells connected to a reference word line to receive a reference word line signal pulse and connected to a reference bit line; and
the word line control circuit is further configured to modulate pulse widths of the word line signal pulses in response to an analog reference signal developed on the reference bit line in response to the actuation of the reference word line by the reference word line signal pulse.

50. The in-memory computation circuit of claim 49, wherein the modulation of the pulse widths of the word line signal pulses compensates for drift in the plurality of memory cells.

51. The in-memory computation circuit of claim 49, wherein the pulse widths of the word line signal pulses are proportional to coefficient data values of the input signals, and wherein proportionality is dependent on the analog reference signal.

52. The in-memory computation circuit of claim 51, wherein the analog reference signal controls a frequency of a clock signal driving a counter circuit, and proportionality is dependent on a digital comparison of the input signal coefficient data value to a counter value.

53. The in-memory computation circuit of claim 51, wherein the analog reference signal controls a slope of a ramp signal, and proportionality is dependent on an analog comparison of the input signal coefficient data value to a ramp signal.

54. The in-memory computation circuit of claim 51, wherein reference word line signal pulse has a pulse width at least equal to a maximum pulse width of the word line signal pulses applied to the first word lines.

* * * * *